United States Patent
Nguyen

(10) Patent No.: US 7,215,161 B2
(45) Date of Patent: May 8, 2007

(54) WAVE SHAPING OUTPUT DRIVER TO ADJUST SLEW RATE AND/OR PRE-EMPHASIS OF AN OUTPUT SIGNAL

(75) Inventor: Huy Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/068,116

(22) Filed: Feb. 28, 2005

(65) Prior Publication Data

US 2006/0192603 A1    Aug. 31, 2006

(51) Int. Cl.
    *H03K 3/017* (2006.01)
(52) U.S. Cl. ............... 327/100; 327/172; 327/108
(58) Field of Classification Search ........... 327/108, 327/112, 126, 100, 261; 326/30, 82
    See application file for complete search history.

(56) References Cited

U.S. PATENT DOCUMENTS 5,739,707 A * 4/1998 Barraclough ............... 327/112
6,452,428 B1 * 9/2002 Mooney et al. ............ 327/108
6,704,818 B1 * 3/2004 Martin et al. ............... 710/100

* cited by examiner

*Primary Examiner*—Dinh T. Le
(74) *Attorney, Agent, or Firm*—Vierra Magen Marcus & DeNiro LLP

(57) ABSTRACT

Integrated circuit, system, method and machine readable media embodiments adjust a slew rate and/or a transmit pre-emphasis of an output signal at selected phases during a bit time. A timing circuit provides a plurality of delayed data signals in response to a clock signal. A plurality of adjustable impedance circuits, including a plurality of select circuits, output a plurality of selected delayed data signals to form the output signal having an adjusted slew rate. Delay elements in the timing circuit are also biased from a current of a lock loop circuit to further adjust slew rate of the output signal. Transmit pre-emphasis of the output signal is adjusted by selecting a polarity of a selected delayed data signal in each of the plurality of adjustable impedance circuits. Each adjustable impedance circuit also includes a predriver and driver for adjusting impedance in response to a signal indicating an impedance value. In an embodiment, an integrated circuit is able to operate in multiple modes of operation depending upon the type of output signal, frequency range of the output signal, physical packaging and/or system configuration.

23 Claims, 12 Drawing Sheets

WAVE SHAPING OUTPUT DRIVER TO ADJUST SLEW RATE AND/OR PRE-EMPHASIS OF AN OUTPUT SIGNAL

FIELD OF THE INVENTION

The present invention generally relates to integrated circuit devices and/or high speed signaling of such devices.

BACKGROUND OF THE RELATED ART

In high speed signaling, integrated circuits provide output signals having particular wave shapes or signal characteristics depending upon the type of output signals transmitted, frequency range of the output signals, physical packaging, and/or system configuration. For example, an integrated circuit included in one interconnect topology configuration, such as a bus architecture, may need a different output signal wave shape than the same integrated circuit in a different interconnect topology configuration, such as a point-to-point connection. Further, if the integrated circuit is coupled to a system having a bus with multiple components, an integrated circuit may need a particular output signal wave shape that is different than when the integrated circuit is coupled to a system having a bus with few components.

In some applications having relatively high inductive packaging and a low output signal frequency, slew rate circuits have been used to wave shape the output signal. In other applications having relatively higher frequency output signals that may be sensitive to capacitive loading and thus may result in inter-symbol interference, equalization circuits may be used to wave shape output signals.

Depending upon a particular type of output signal used, frequency range of the output signals, physical packaging and/or system configuration, an integrated circuit will need to provide an output signal having a wide range of signal characteristics or wave shapes.

BRIEF DESCRIPTION OF THE DRAWING

Embodiments are illustrated by way of example, and not by way of limitation, in the figures of the accompanying drawings, which like reference numerals refer to similar elements.

DETAILED DESCRIPTION

Figure 1:
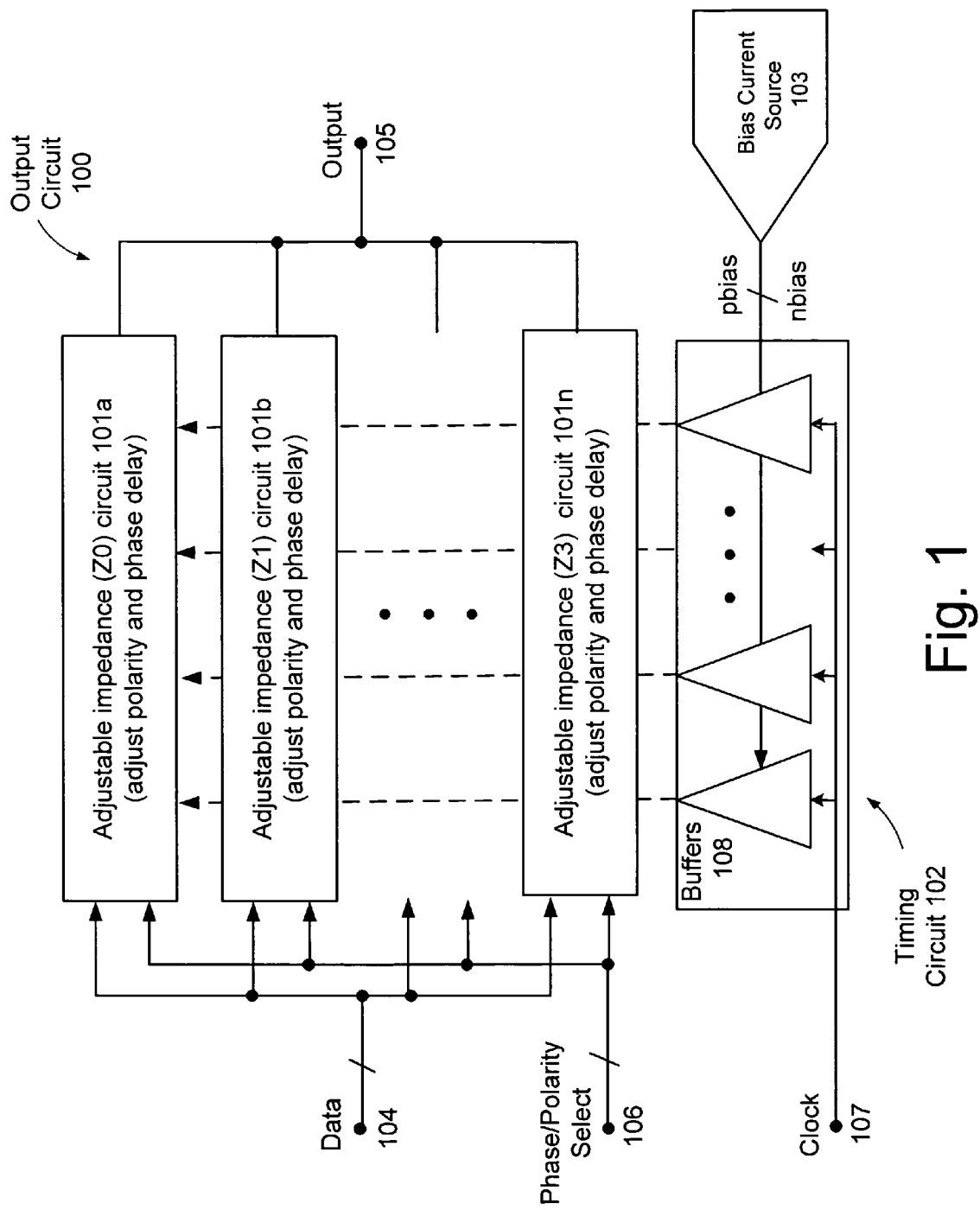
FIG. 1 illustrates a output circuit 100 to adjust a slew rate and/or transmit pre-emphasis of an output signal according to an embodiment.

Integrated circuit, system, method and machine-readable media embodiments wave shape an output signal during a time interval, such as a bit time or symbol time. In an embodiment, slew rate and/or transmit pre-emphasis of an output signal is adjusted during a bit time. In an embodiment, slew rate is the amount of change of a signal level or signal value per unit of time. In an embodiment, transmit pre-emphasis refers to adjusting a portion of an output signal at selected times or phases in a bit time. The output signal may be adjusted to compensate for any unwanted change in the output signal wave shape that may occur before reaching the output signal destination. For example, the output signal may be adjusted when transmitted in a particular system, on a particular interconnect or when transmitted in relation to other sequential signals. For example, a portion of a signal may be adjusted to reduce the effect of inter-symbol interference.

In an embodiment, a timing circuit provides a plurality of delayed data signals in response to a clock signal. A plurality of adjustable impedance circuits, including a plurality of select circuits, output a plurality of selected delayed data signals to form the output signal having an adjusted slew rate. Delay elements in the timing circuit are also biased from a current of a lock loop circuit to further adjust a slew rate of the output signal. Transmit pre-emphasis of the output signal is adjusted by selecting a polarity of a selected delayed data signal in at least one of the plurality of adjustable impedance circuits. Each adjustable impedance circuit also includes a predriver and driver for adjusting impedance in response to a signal indicating an impedance value.

In an embodiment, a timing circuit includes a multiplexer to provide data signals to a plurality of delay elements in response to a clock signal. The plurality of delay elements provide the plurality of delayed data signals to a plurality of buffers. In an embodiment, a delay lock loop circuit provides a current to the plurality of delay elements and the plurality of buffers to adjust the slew rate of the output signal.

In an embodiment, an integrated circuit operates in multiple output signal modes depending upon the type of output signal, frequency range of the output signal, physical packaging and/or system configuration. In a first mode of operation, a slew rate of the output signal in a bit time is adjusted by providing a plurality of delayed data signals from a plurality of adjustable impedance circuits. In a second mode of operation, a transmit pre-emphasis of an output signal in a bit time is adjusted by selecting a polarity of a selected delay data signal from an adjustable impedance circuit. In a third mode of operation, a slew rate and a transmit pre-emphasis of an output signal in a bit time is adjusted.

In another embodiment, a system, such as a memory system, includes and output circuit having a timing circuit and a plurality of adjustable impedance circuits including select circuits and driver circuits. The plurality of adjustable impedance circuits provide a plurality of selected delayed data signals with selected polarity to adjust a slew rate and transmit pre-emphasis of the output signal.

In yet another embodiment, a method of operating an integrated circuit is provided. A determination is made whether to adjust a slew rate of an output signal during a bit time. A slew rate of an output signal in a bit time is then adjusted. A determination is made whether to adjust a transmit pre-emphasis of an output signal during the bit time. Transmit pre-emphasis of the output signal is then adjusted in a bit time.

FIG. 1 illustrates output circuit 100 to provide adjustable slew rate and/or transmit pre-emphasis to an output signal at output 105. Output circuit 100 can either selectively adjust the slew rate of an output signal during a time interval, such as a bit time or symbol time, or provide transmit pre-emphasis to the output signal at output 105 during the time interval at selected phases. In an embodiment, bit time refers to an amount of time used to transfer a signal representing a symbol or bit of information. Output circuit 100 can also adjust both the slew rate and transmit pre-emphasis of an output signal during a bit time at selected phases.

A plurality of data signals are provided at input 104 to each of a plurality adjustable impendence circuits 101a–n. In an embodiment, four adjustable impedance circuits are used (or Z0–Z3). A timing circuit 102 provides phase or time delay to the data signals provided to adjustable impedance circuits 101a–n in response to a reference clock signal and bias current source 103. In an embodiment, bias current source 103 is a delay lock loop circuit or phase lock loop circuit. Bias current, such as nbias and pbias signals, is provided from an output of a charge pump in a delay lock loop or a phase lock loop circuit. Nbias and pbias signals provides process-, voltage- and temperature-tracking information to maintain a desired slew rate and/or amplitude of the plurality of delayed data signals, thereby maintaining a desired slew rate despite process variations and changes in voltage and temperature.

A bias current then may be used to bias buffers 108, thus providing a first adjustment to slew rate of an output signal. Additional slew rate adjustment is provided by selecting which delayed data signals are summed or combined at a particular phase or time in a bit time of an output signal.

Phase/polarity select signals provided at input 106 of adjustable impedance circuits 101a–n indicate which delayed data signals are provided to a particular adjustable impedance circuit at a particular phase and the polarity of the selected delayed data signals. Thus one or more signals are output from adjustable impedance circuits 101a–n at output 105 to provide a combined or summed output signal having an adjusted slew rate and transmit pre-emphasis during a bit time.

In an embodiment, a clock signal is provided at input 107 of timing circuit 102. In an embodiment, a clock signal, such as a clock-from-master ("CFM") clock signal, is provided to an output circuit 100 disposed in a device, such as integrated circuit memory device 1020, by a master device 1010 shown in FIG. 10. In alternate embodiments, a clock signal is provided by another source, such as a clock generator. In other embodiments, a clock signal serves as a reference signal for a clock recovery circuit, which generates a clocking signal at input 107.

Figure 2:
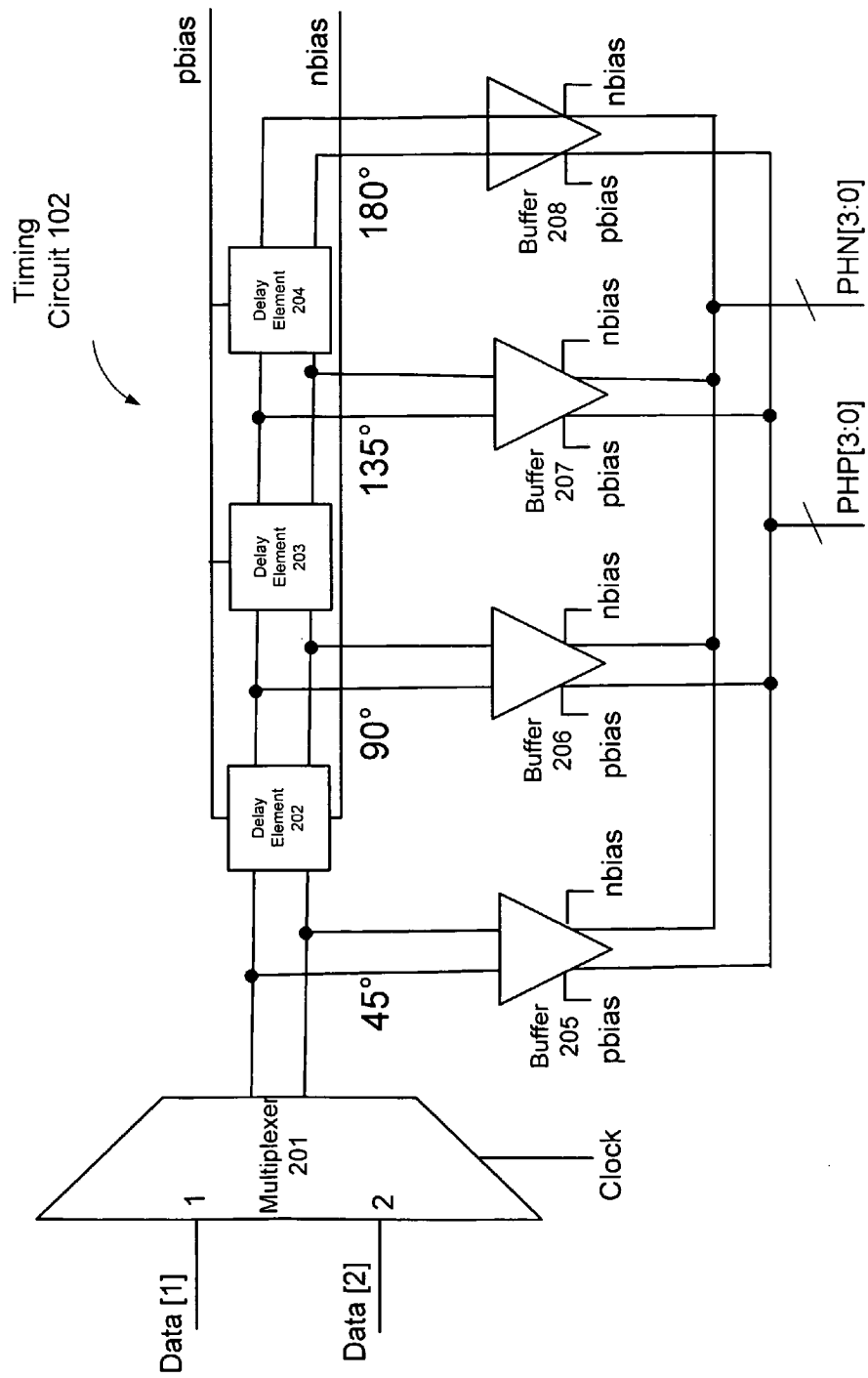
FIG. 2 illustrates a timing circuit shown in FIG. 1 according to an embodiment.

FIG. 2 illustrates a timing circuit 102 shown in FIG. 1. In an embodiment, timing circuit 102 provides a plurality of phase or time delayed data signals to adjustable impedance circuits 101a–n during a bit time. Data [1:0] is input to multiplexer 201 that outputs sampled differential data signals in response to a reference clock signal. Differential data signals are then input to a plurality of series coupled delay elements 202–204 to delay the differential data signal. In an embodiment, four data signals having 45 degree phase differences in a bit time are output as a plurality of differential signals to buffers 205–208. In an embodiment, buffers 205–208 represent buffers 108 shown in FIG. 1. Multiplexer 201 provides the first 45 degree delay in an embodiment. Positive delayed data signals PHP[3:0] are output from respective buffers 205–208 to each positive driver circuit 310a–n and negative delayed data signals PHN[3:0] are output from respective buffers 205–208 to each negative driver circuit 320a–n shown in FIG. 3. In alternate embodiments, the plurality of delayed data signals may have more or less phase differences in a bit time. Bias current nbias and pbias are provided to delay elements 202–204 and buffers 205–208 in order to adjust a slew rate of an output signal. Bias current nbias and pbias are bias currents representing tracking information from a lock loop circuit in output circuit 100.

Figure 3:
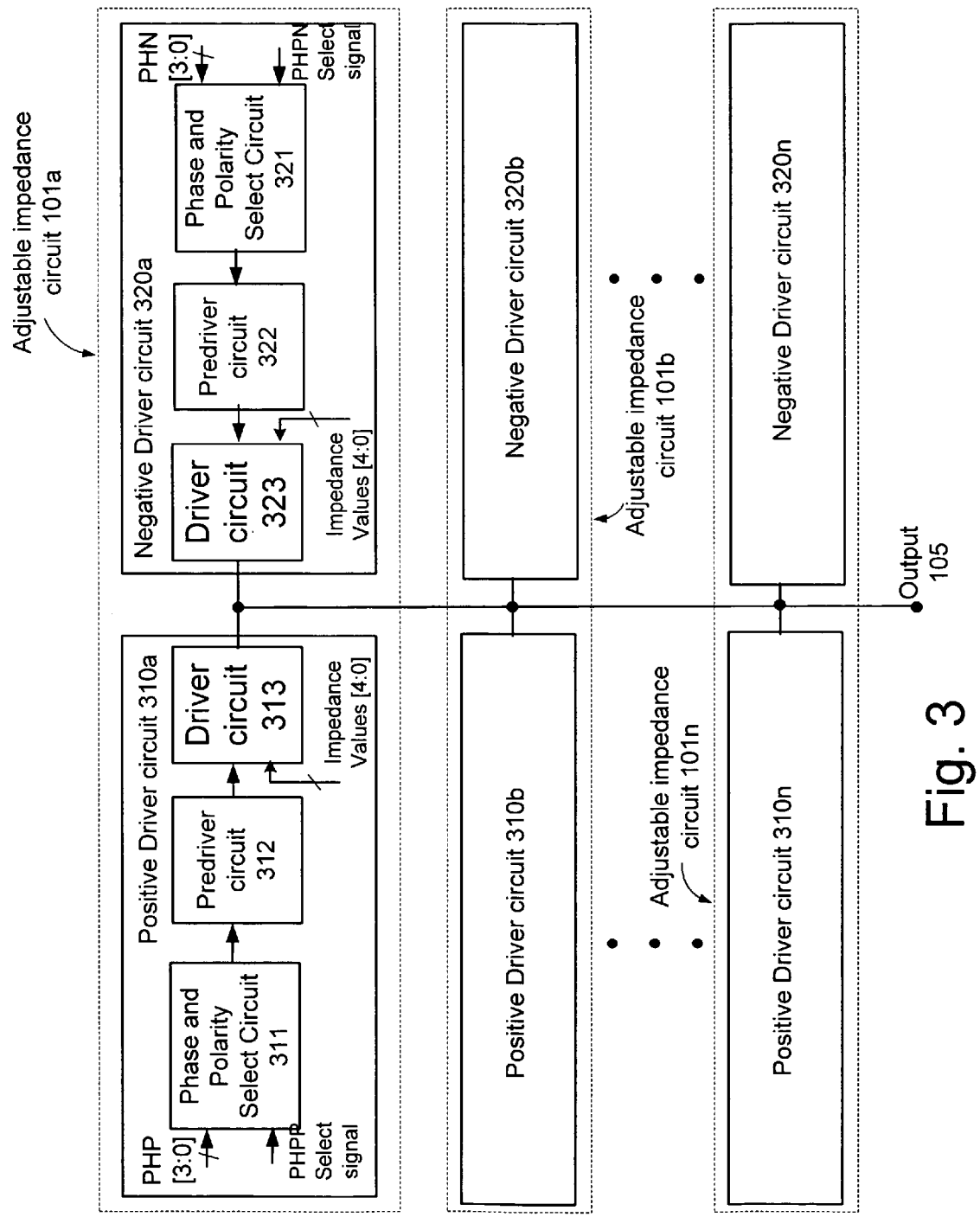
FIG. 3 illustrates an adjustable impedance circuit shown in FIG. 1 according to an embodiment.

FIG. 3 illustrates adjustable impedance circuits 101a–n shown in FIG. 1. In an embodiment, adjustable impedance circuit 101a includes a positive type driver circuit 310a and a negative type driver circuit 320a coupled to an output 105. In an embodiment, each adjustable impedance circuit 101b–n includes positive type driver circuits 310a–n and negative type driver circuits 320b–n coupled to output 105. In an embodiment, positive delayed data signals PHP[3:0] are provided to positive type driver circuits 310a–n and negative delayed data signals PHN[3:0] are provided to negative type driver circuits 320a–n. Similarly, positive and negative phase and polarity PHPP and PHPN select signals are provided to positive type driver circuits 310a–n and negative type driver circuits 320a–n. PHPP and PHPN select signals indicate a particular delayed data signal and polarity of the selected delayed data signal input to respective positive type driver circuits 310a–n and negative type driver circuits 320a–n.

In an embodiment, positive driver circuit 310a includes a phase and polarity select circuit 311 to receive delayed data signals PHP[3:0] and PHPP select signals. Phase and polarity select circuit 311 provides a particular delayed data signal having a selected polarity to predriver circuit 312 which outputs the selected delayed data signal having selected polarity to driver circuit 313. In an embodiment, driver circuit 313 outputs the selected delayed data signal at output 105 in response to impedance values [4:0]. In an embodiment, the output signal from positive driver circuit 310a along with other output signals from other adjustable impedance circuits coupled to output 105 are summed or combined.

In an embodiment, PHPP and PHPN select signals are provided in response to values stored in one or more registers. In an embodiment, one or more registers are in a master device 1010 and/or integrated circuit memory device 1020 shown in FIG. 10. In particular, control logic 1011 and control logic 1022 include registers having values used to provide PHPP and PHPN select signals. Values stored in one or more registers indicate the type of output signals to be output by output circuit 100, such as a Stub-Series Terminated Logic (SSTL) output signal, a Rambus® Signaling Level (RSL) or a Quad Rambus Signaling Level (QRSL™) output signal or frequency range of the output signal. In embodiments, values stored in the one or more registers indicate a type of packaging used for output circuit 100 or a system configuration in which output circuit 100 is implemented.

In an embodiment, the values are stored during manufacturing, testing and/or during calibration. In an alternate embodiment, the values are stored to optimize the output signals based on prior test data or a pseudo random sequence of data used to provide output signals. In still a further embodiment, the values are stored after receiving test signals that are output and then retransmitted from a receiving device. In an embodiment, the values are stored in a combination of methods described above.

In an embodiment, a Serial Presence Detect (SPD) device or a Basic Input/Output System (BIOS) may be used to generate the phase and polarity PHPP and PHPN select signals. An SPD device is a non-volatile memory device that may be included on a memory module, such as a dual-inline memory module (DIMM), or elsewhere in memory system 1000 embodiments described below. The SPD device stores information used by memory system 1000 to properly configure memory system 1000. In an embodiment, memory system 1000 reads information from an SPD device and writes the information for generating phase and polarity PHPP and PHPN select signals at memory system 1000 initialization or power-up.

Negative driver circuit 320*a* includes a driver circuit 323, predriver circuit 322 and phase and polarity select circuit 321 similar to positive driver circuit 310*a*. Negative delayed data signals PHN[3:0] are input to phase and polarity select circuit 321 along with PHPN select signals to provide an output signal at output 105 that may be combined or summed with other output signals from other adjustable impedance circuits.

Figure 4:
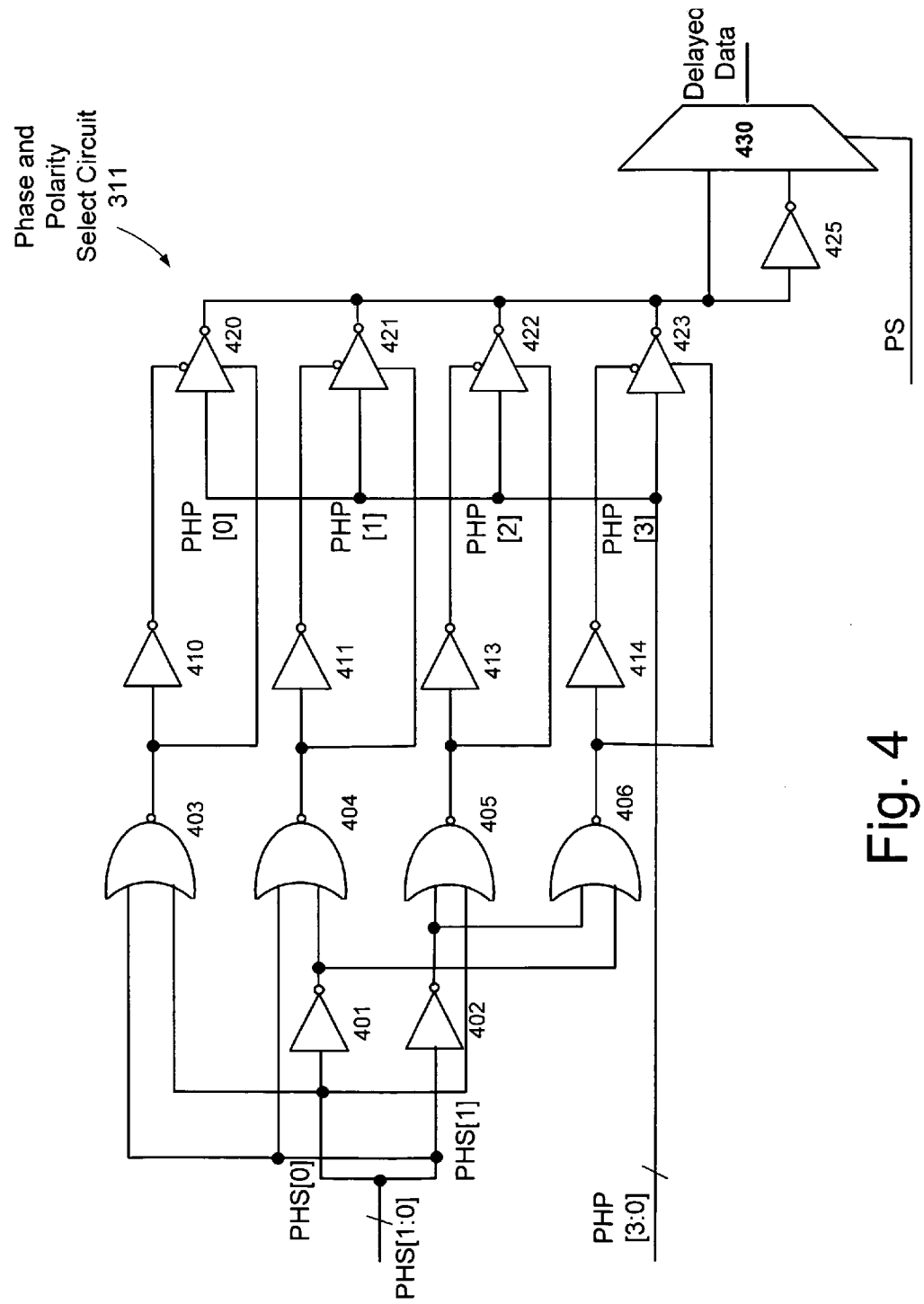
FIG. 4 illustrates a phase and polarity select circuit shown in FIG. 3 according to an embodiment.

FIG. 4 illustrates a phase and polarity select circuit 311 illustrated in FIG. 3. Phase and polarity select circuit 311 selects one of a plurality of delayed data signals PHP[3:0] and a polarity of the selected delayed data signal in response to a 2-bit phase select signal PHS[1:0] and a polarity select signal PS. In an embodiment, phase select signal PHS[1:0] and polarity select signal PS represent PHPP select signals described above in FIG. 3. Phase select signal PHS [1:0] is provided to inputs of NAND gates 403–406 as well as inputs of inverters 401 and 402. Outputs of NAND gates 403–406 are provided to inputs of inverters 410–414. Delayed data signals PHP[3:0] are provided to tristate buffers 420–423 that output a selected delayed data signal in response to the signals input and output from inverters 410–414. Outputs of tristate buffers 420–423 are provided to an input of inverter 425 and multiplexer 430. An output of inverter 425 is also input to multiplexer 430. Multiplexer 430 then outputs a selected polarity of a selected delayed data signal PHP[3:0] output from one of the tristate buffers 420–423 in response to a polarity select signal PS.

Figure 5:
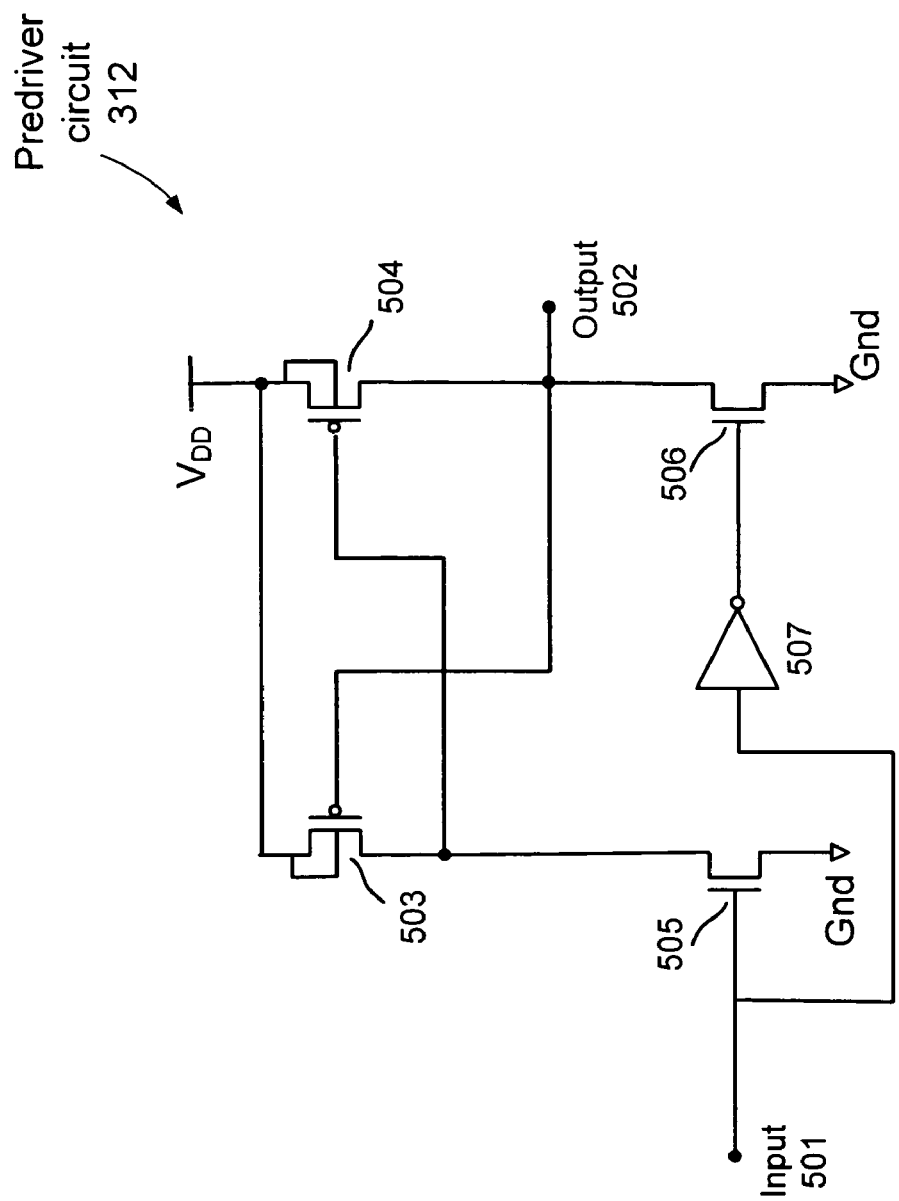
FIG. 5 illustrates a predriver circuit shown in FIG. 3 according to an embodiment.

FIG. 5 illustrates a predriver circuit 312 shown in FIG. 3. In an embodiment, predriver circuit 312 is a buffer device and level shifter circuit. In an embodiment, predriver circuit 312 is a buffer or a register that stores a delayed data signal from phase and polarity select circuit 311. In a level shifter circuit embodiment, predriver circuit 312 includes p-type transistors 503 and 504 having sources and gates coupled to a voltage source, such as voltage source $V_{DD}$. A drain of transistor 503 is coupled to a gate of transistor 504 and a drain of n-type transistor 505. A drain of transistor 504 is coupled to a gate of transistor 503 and a drain of n-type transistor 506 and output 502. Input 501 is coupled to a gate of transistor 505 and an input of inverter 507. A source of transistors 505 and 506 are coupled to a ground reference Gnd. An output of inverter 507 is coupled to a gate of transistor 506. In an embodiment, a selected delayed data signal having a selected polarity is provided to the input 501 and the signal level is shifted a predetermined amount at output 502. In alternate embodiments, different types of transistors may be used for circuits described herein.

Figure 6:
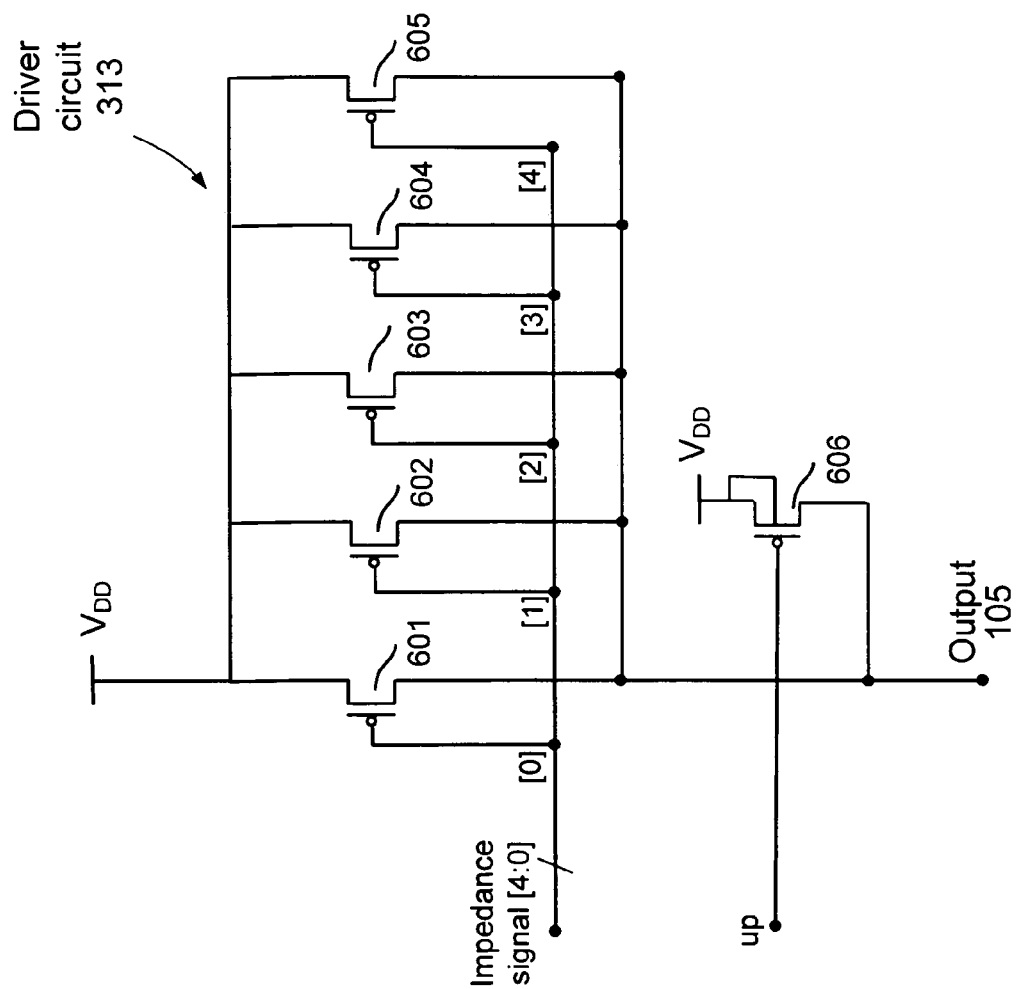
FIG. 6 illustrates a driver circuit shown in FIG. 3 according to an embodiment.

FIG. 6 illustrates a driver circuit 313 shown in FIG. 3. In an embodiment, driver circuit 313 includes p-type transistors 601–605 having sources coupled to a voltage source, such as voltage source $V_{DD}$. Drains of transistors 601–605 are coupled to output 105. Impedance signal [4:0] is provided to gates of transistors 601–605 to provide predetermined or programmed amplitude of an output signal provided at output 105. In an embodiment, impedance signal [4:0] is a control word obtained from impedance values stored in one or more registers as described above. An Up signal is provided to a gate of p-type transistor 606. In an embodiment, an Up signal is provided by output 502 of predriver circuit 312, in particular an Up signal represents a selected delay data signal having a selected polarity. A source of transistor 606 is coupled to a gate of transistor 606 and a voltage source, while a drain of transistor 606 is coupled to output 105.

Figure 7:
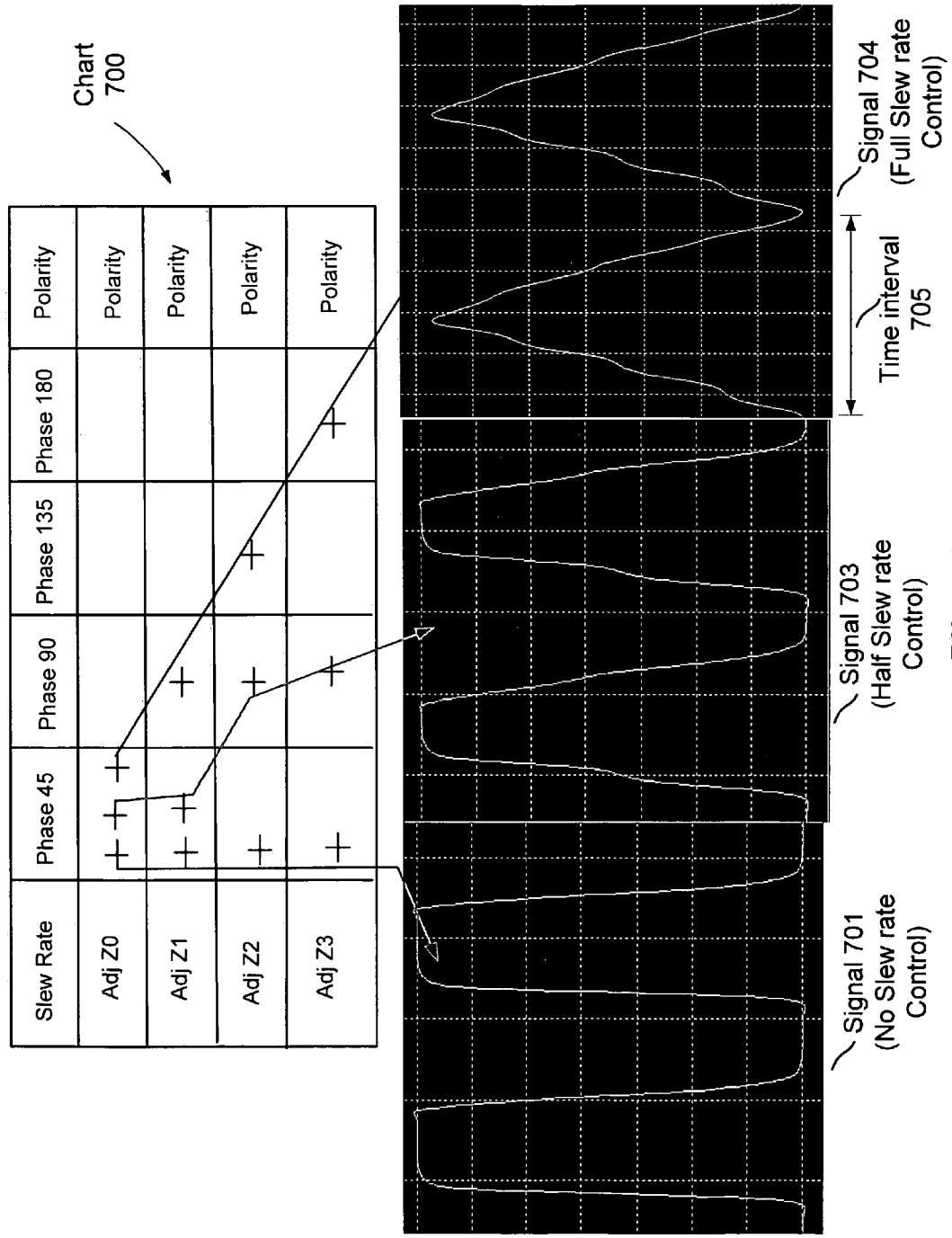
FIG. 7 illustrates wave shaping an output signal by adjusting slew rate using output circuit 100 according to an embodiment.
Figure 8:
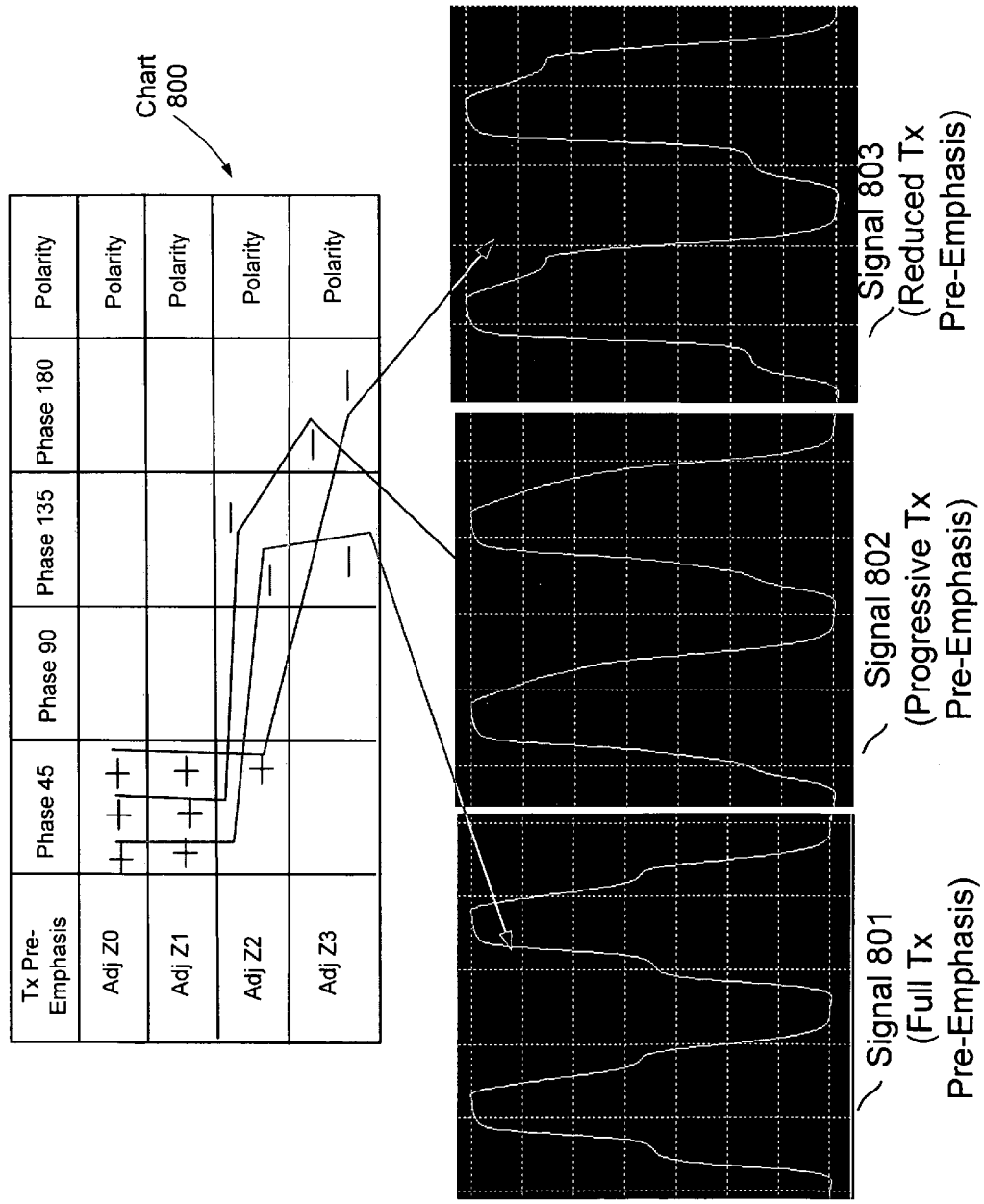
FIG. 8 illustrates wave shaping an output signal by adjusting transmit pre-emphasis using output circuit 100 according to an embodiment.
Figure 9:
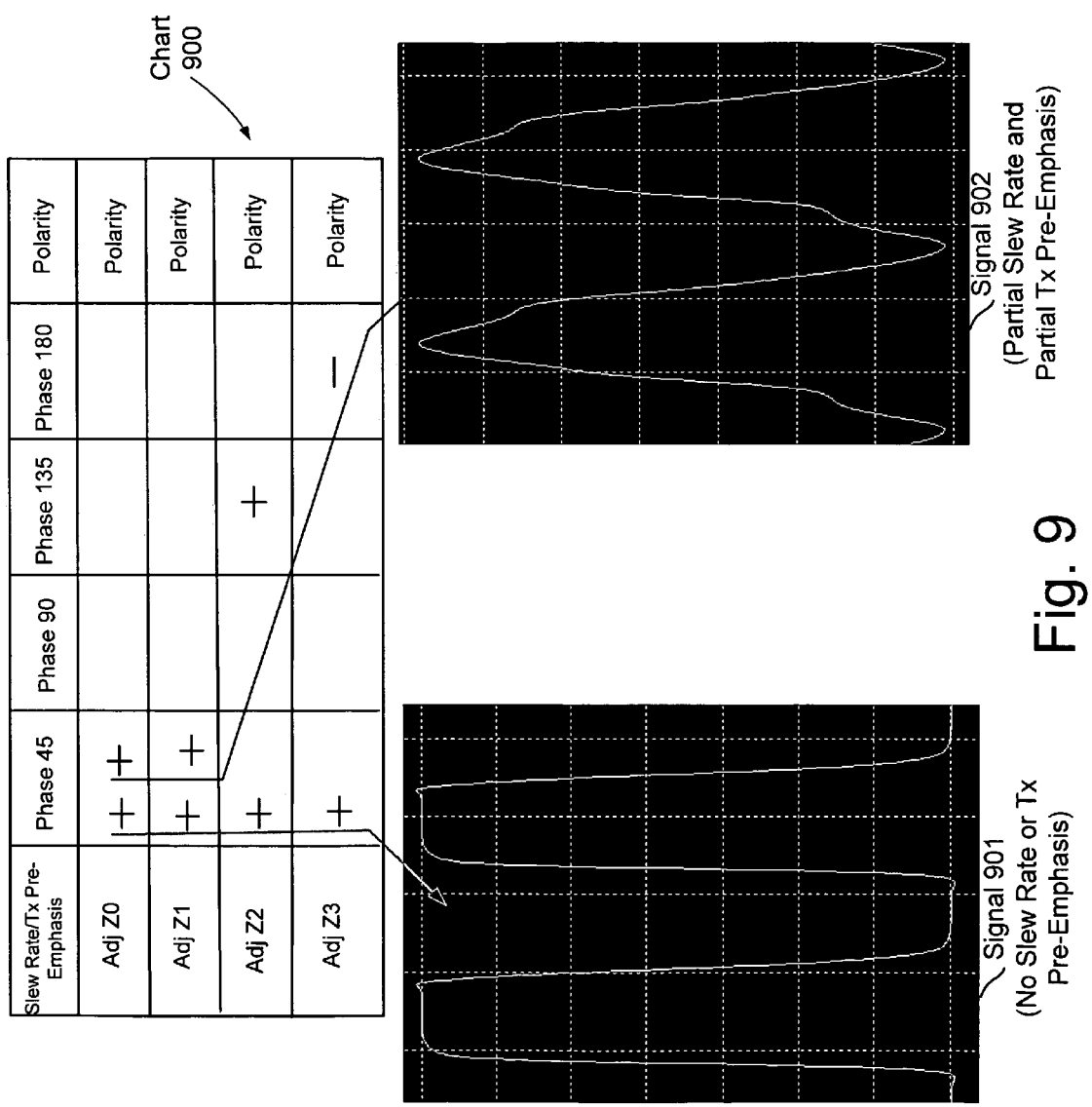
FIG. 9 illustrates wave shaping an output signal by adjusting slew rate and transmit pre-emphasis using output circuit 100 according to an embodiment.

FIGS. 7–9 illustrate wave shaping output signals provided by output circuit 100 when adjusting slew rate and/or transmit pre-emphasis of an output signal at particular phases in a bit time. FIG. 7 illustrates a chart 700 identifying adjusting or decreasing slew rate of output signals 702–703 as compared to output signal 701 and not adjusting transmit pre-emphasis. Output signal 701 illustrates an output signal in which slew rate is not adjusted by outputting four delayed data signals having 45 degrees of phase delay from four adjustable impedance circuits Z0–Z3. Output signal 703 illustrates an output signal in which slew rate is reduced by summing two delayed data signals having 45 degrees of phase delay from two adjustable impedance circuits Z0 and Z1 and two delayed data signals having 90 degrees of phase delay from two adjustable impedance circuits Z2 and Z3 during a bit time. Output signal 704 illustrates an output signal in which slew rate is further reduced by summing four delayed data signals from four adjustable impedance circuits Z0, Z1, Z2 and Z3 having 45, 90, 135 and 180 degrees of phase delay during a bit time or time interval 705. As indicated by chart 700, the polarities, as indicated by the plus sign, of the delayed data signals are not adjusted to provide transmit pre-emphasis.

FIG. 8 illustrates a chart 800 that identifies when transmit pre-emphasis is applied or adjusted in output signals 801–803 during a bit time. In other words, chart 800 illustrates when a polarity of a selected delayed data signal is adjusted or negated in order to provide transmit pre-emphasis at a selected phase of an output signal during a bit time. Output signal 801 illustrates an output signal in which full transmit pre-emphasis is applied by negating the polarity of selected delayed data signals having a phase delay of 135 degrees from adjustable impedance circuits Z2 and Z3. Output signal 802 illustrates an output signal in which progressive transmit pre-emphasis is applied by negating the polarity of selected data signals having a phase delay of 135 and 180 degrees from adjustable impedance circuits Z2 and Z3. Output signal 803 illustrates an output signal in which transmit pre-emphasis is reduced by negating the polarity of a selected data signal having a phase delay of 180 degrees from adjustable impedance circuit Z3, while the adjustable impedance circuits Z0–Z2 output delayed data signals having a phase delay of 45 degrees that are summed with the negated polarity of the selected data signal from adjustable impedance circuit Z3.

FIG. 9 illustrates a chart 900 identifying adjusting or decreasing slew rate and applying transmit pre-emphasis to output signal 902 during a bit time. Output signal 901 illustrates an output signal in which slew rate and transmit pre-emphasis is not adjusted. Output signal 902 illustrates an output signal in which slew rate is decreased and transmit pre-emphasis is applied by outputting two selected data signals having a 45 degree phase delay from adjustable impedance circuits Z0 and Z1 as well as a selected data signal having a 135 degree phase delay from adjustable impedance circuit Z2 and a negated polarity selected data signal having a 180 degree phase delay from adjustable impedance circuit Z3 during a bit time.

Figure 10:
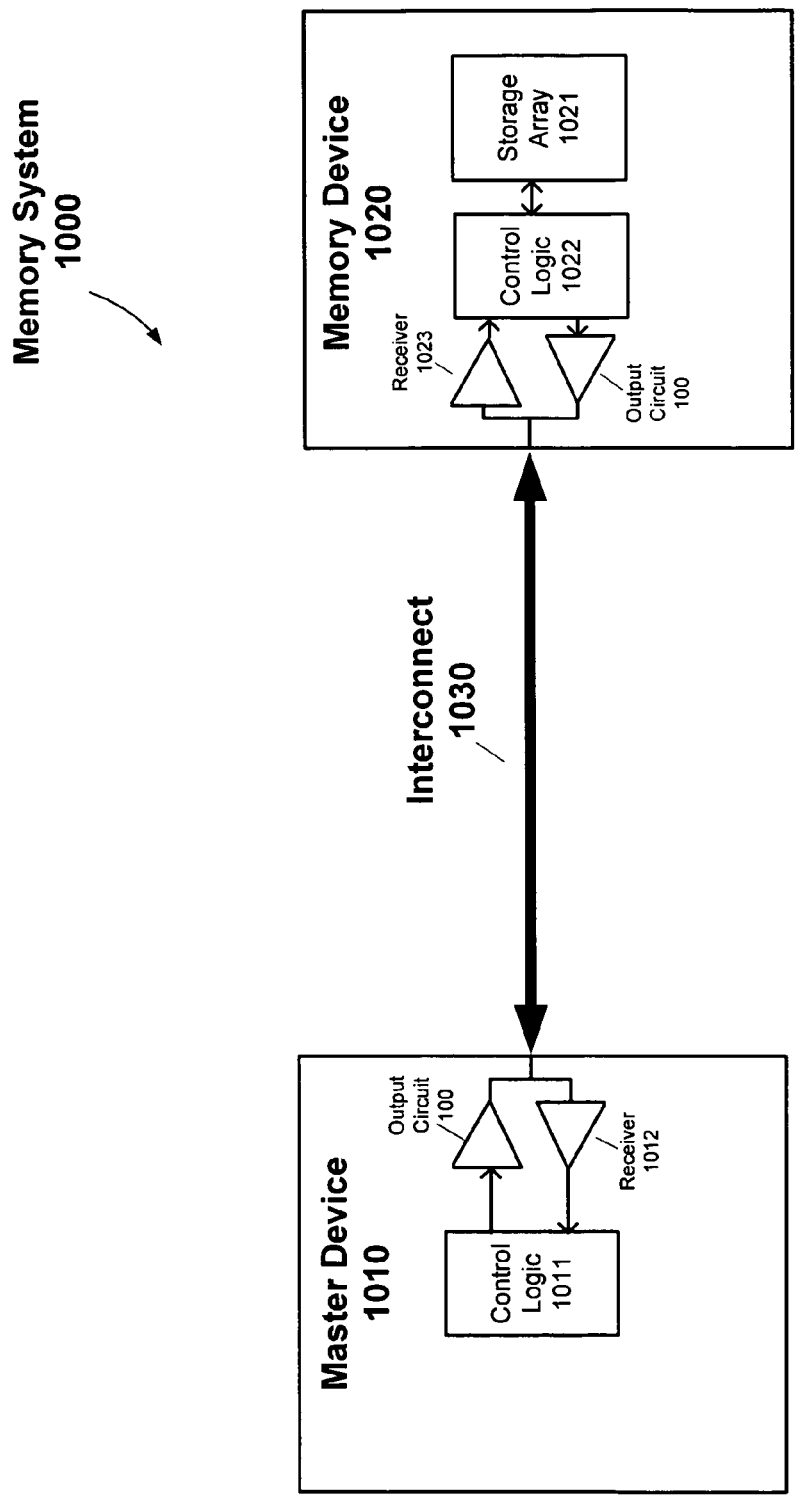
FIG. 10 illustrates a memory system having an output circuit 100 according to an embodiment

FIG. 10 illustrates a memory system 1000 including a master device 1010 coupled to an integrated circuit memory device 1020 by interconnect 1030. Master device 1010 includes control logic 1011, a receiver 1012 and output circuit 100 as shown in FIG. 1. In an embodiment, control logic 1011 is a processor and registers to store values as described above. In an embodiment, output circuit 100 in master device 1010 and integrated circuit memory device 1020 is included in a transmitter and/or transceiver for providing output signals on one or more signal lines of interconnect 1030. Output signals provided by output circuit 100 may represent control, address and/or data (read or write data) information to or from integrated circuit memory device 1020. Integrated circuit memory device 1020 includes control logic 1022, storage array 1021, receiver 1023 and output circuit 100 as illustrated in FIG. 1. In an embodiment, control logic 1022 includes a row and column decoders for accessing storage array 1021 to provide write data and obtain read data. In an embodiment, control logic 1022 includes registers to store values as described above.

Figure 11:
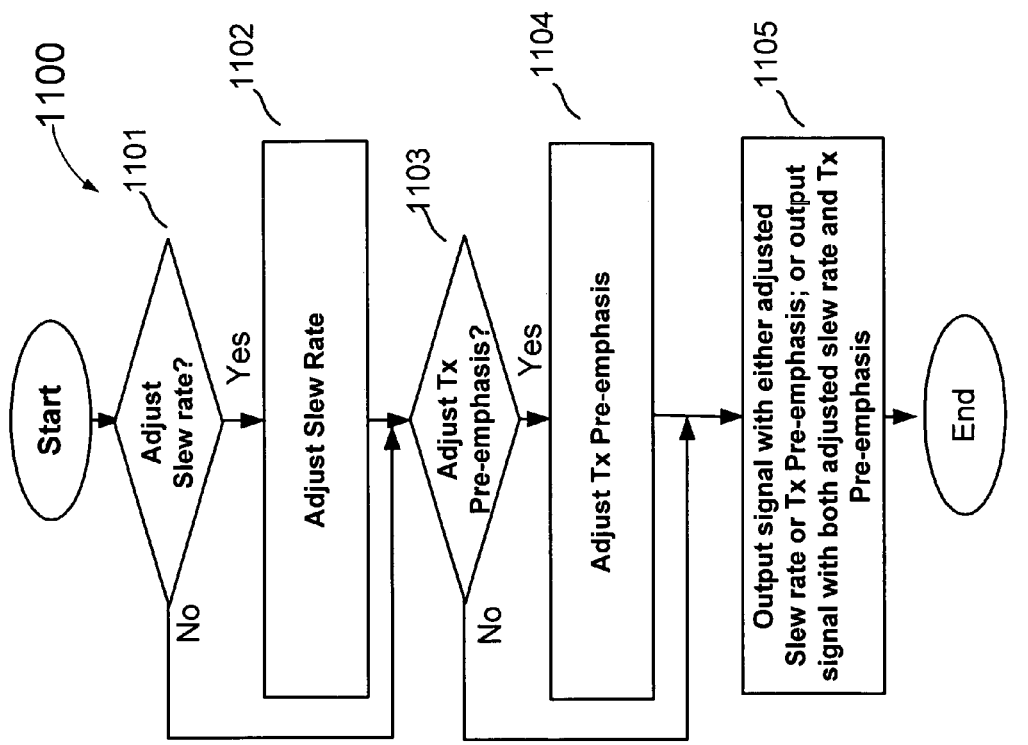
FIGS. 11 and 12 are flow charts illustrating a method according to an embodiment.
Figure 12:
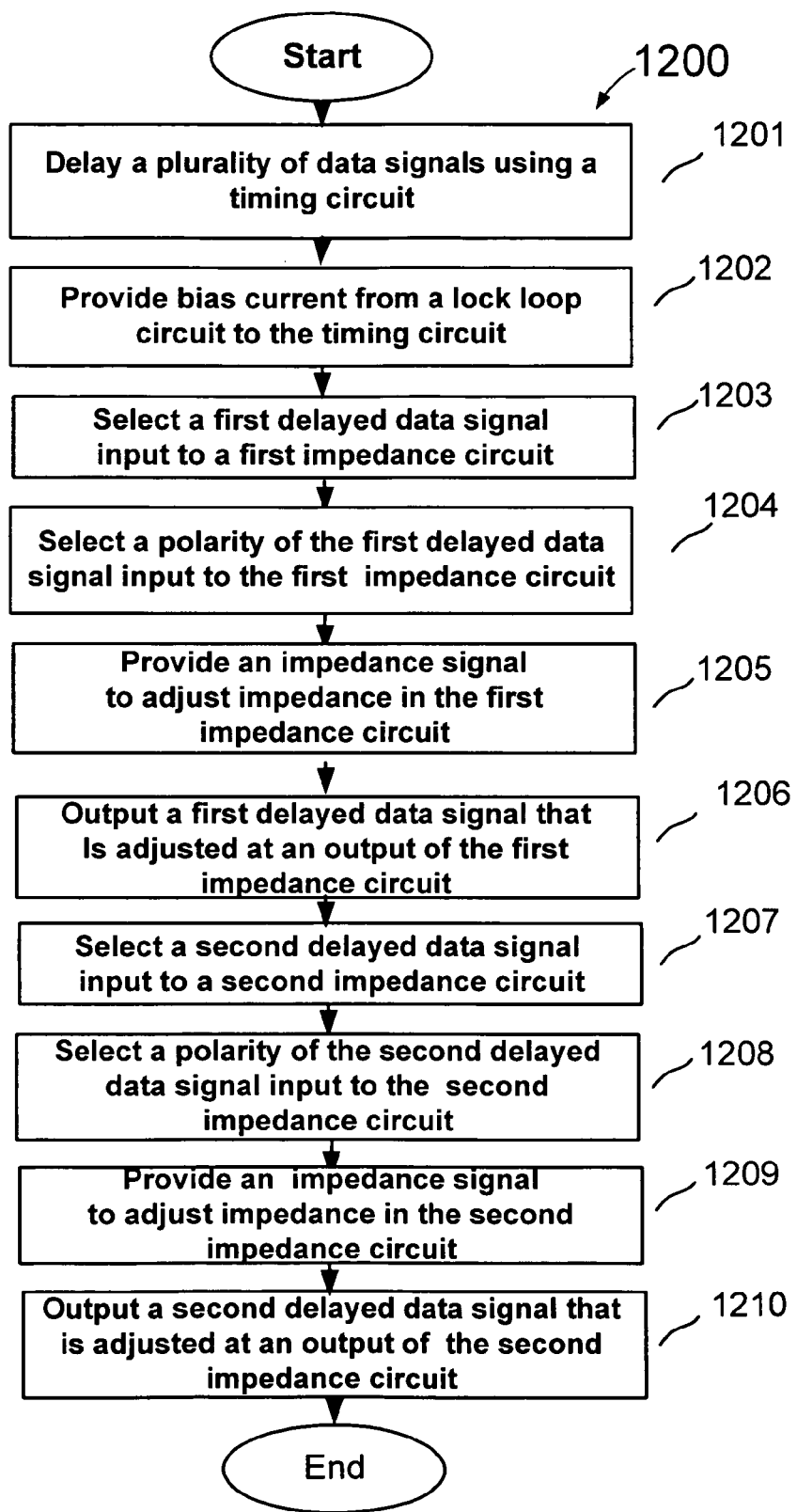

FIGS. 11–12 illustrate method 1100 and 1200 embodiments for operating an output circuit, such as output circuit 100 shown in FIG. 1. In alternate embodiments of the present invention, steps or logic blocks illustrated in FIGS. 11–12 are carried out by hardware, software or a combination thereof. In alternate embodiments, the circuits illustrated in FIGS. 1–6 and 10 carry out the steps illustrated in FIGS. 11–12. Other steps that are not shown may be included in various embodiments. Similarly, steps that are shown may be excluded in various embodiments. Also, while methods 1100 and 1200 are described in sequential steps, method steps or logic blocks of methods 1100 and 1200 are completed very quickly or almost instantaneously.

FIG. 11 illustrates a method 1100 that begins at logic block 1101 where a determination is made whether a slew rate of an output signal in a bit time is adjusted. In an embodiment, control logic makes a determination by reading a value from a register. If a slew rate of an output signal is to be adjusted, control transitions to logic block 1102 where the slew rate of the output signal is adjusted. In an embodiment, a slew rate of an output signal is adjusted by output circuit 100, and in particular by summing a plurality of phase delayed data signals from a plurality of adjustable impedance circuits 101a–n. Control then transitions to logic block 1103. If a slew rate of an output signal is not to be adjusted, control also transitions to logic block 1103, where a determination is made whether transmit pre-emphasis of an output signal is to be adjusted or applied. If a transmit pre-emphasis of an output signal is to be adjusted, control transitions to logic block 1104; otherwise, control transitions to logic block 1105. In logic block 1104, transmit pre-emphasis is applied to an output signal during a bit time. In an embodiment, adjustable impedance circuits 101a–n provide transmit pre-emphasis to an output signal by selecting a polarity of a delayed data signal in an adjustable impedance circuit. Control transitions to logic block 1105, where an output signal is provided with either an adjusted slew rate or adjusted transmit pre-emphasis, or both an adjusted slew rate and adjusted transmit pre-emphasis. Method 1100 then ends.

FIG. 12 illustrates a method 1200 that begins at logic block 1201 where a plurality of data signals are delayed. In an embodiment, a timing circuit delays a plurality of data signals. A bias current from a lock loop circuit, such a delay lock loop circuit, is provided to a timing circuit 102 to adjust a slew rate of an output signal as illustrated in logic block 1202. A first delayed data signal is selected to be input into a first adjustable impedance circuit in logic block 1203. A polarity of the selected first delayed data signal input into the first adjustable impedance circuit is selected in logic block 1203. In an embodiment, phase and polarity select circuit 311 performs the operations illustrated by logic block 1203 and 1204 in response to select signals from control logic. A signal indicating an impedance value is provided to the first adjustable impedance circuit as shown by logic block 1205. A first delayed data signal is output from the first adjustable impedance circuit as illustrated by logic block 1206. A second adjustable impedance circuit selects a second delayed data signal and polarity as illustrated by logic blocks 1207 and 1208. A signal indicating an impedance value is provided to the second adjustable impedance circuit as illustrated in logic block 1209. A second delayed data signal is output from the second adjustable impedance circuit as illustrated by logic block 1210. In an embodiment, the first and second delayed data signals that are adjusted by respective adjustable impedance circuits are output at the same output to form a wave shaped signal having a predetermined slew rate and/or transmit pre-emphasis. Method 1200 ends.

Returning to the embodiments illustrated by FIG. 10, master device 1010 and memory device 1020 includes a plurality of conducting contacts, such as pins and/or balls, for coupling to interconnect 1030 and one or more clock signal lines.

Storage array 1021 includes multiple memory banks having a two dimensional array of storage cells. In embodiments, storage cells of storage array 1021 may be dynamic random access memory ("DRAM") cells, static random access memory ("SRAM") cells, FLASH cells, ferroelectric RAM ("FRAM") cells, magnetoresistive or magnetic RAM ("MRAM") cells, or other equivalent types of memory storage cells. In an embodiment, integrated circuit memory device 1020 is a double data rate SDRAM ("DDR") integrated circuit memory device or later generation memory device (e.g., "DDR2"). In an alternate embodiment, integrated circuit memory device 1020 is an XDR™ DRAM integrated circuit memory device or Direct Rambus® DRAM ("DRDRAM") memory device.

In embodiments, master device 1010 is a memory controller, which may be an integrated circuit device that contains other interfaces or functionality, for example, a Northbridge chip of a chip set. The memory controller may be integrated on a microprocessor or a graphics processor unit ("GPU") or visual processor unit ("VPU"). The memory controller may be implemented as a field programmable gate array ("FPGA"). The memory device 1020 and master device 1010 may be included in various systems or subsystems such as personal computers, graphics cards, set-top boxes, cable modems, cell phones, game consoles, digital television sets (for example, high definition television ("HDTV")), fax machines, cable modems, digital versatile disc ("DVD") players or network routers.

In an embodiment, integrated circuit memory device 1010 is positioned on a substrate in a memory module, such as a dual-in-line-module (DIMM) that includes a plurality of memory devices employed with a connector interface that includes contacts.

In an alternate embodiment, master device 1010, integrated circuit memory device 1020 and associated interconnects are in one or more integrated monolithic circuits having one or more output circuits 100. In embodiments, master device 1010 is a memory controller, peer device or slave device. In an embodiment, output circuit 100 is included in an integrated circuit that is not in a master device or integrated circuit memory device. In an embodiment, output circuit 100 is included in an integrated monolithic circuit.

Signals described herein may be transmitted or received between and within devices/circuits by electrical conductors and generated using any number of signaling techniques including without limitation, modulating the voltage or current level of an electrical signal. The signals may represent any type of control and timing information (e.g. commands, address values, clock signals, and configuration information) as well as data. Also, a single signal illustrated may represent a plurality of signals on respective signal lines in an embodiment.

In embodiments, interconnects described herein include a plurality of conducting elements or conducting paths such as a plurality of wires and/or metal traces/signal lines. In an embodiment, a single conducting path illustrated in the Figures may be replaced by multiple conducting paths and multiple signal paths illustrated in the Figures may be replaced by a single conducting path. In embodiments, an interconnect may include a bus and/or point-to-point connection. In an embodiment, interconnects include control and data signal lines. In an alternate embodiment, interconnects include only data signal lines or only control signal lines. In still other embodiments, interconnects are unidirectional (signals that travel in one direction) or bidirectional (signals that travel in two directions) or combinations of both unidirectional signal lines and bidirectional signal lines.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments of the present invention has been provided for the purposes of illustration and description. It is not intended to be exhaustive or to limit the embodiments to the precise forms disclosed. Modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit comprising:
   a timing circuit to provide a plurality of delayed data signals, during a time interval used to transfer a signal representing a bit of information; and
   an adjustable impedance circuit including,
      a select circuit to provide a first delayed data signal from the plurality of delayed data signals in response to a signal indicating a selection of the first delayed data signal, the select circuit adjusting a polarity of the first delayed data signal in response to a signal indicating a selection of the polarity of the first delayed data signal, and
      a driver circuit to provide an adjustable impedance in response to a signal indicating an impedance value so that the first delayed data signal is adjusted at an output.

2. The integrated circuit of claim 1, wherein the time interval used to transfer a signal representing the bit of information is a bit time.

3. The integrated circuit of claim 1, wherein the timing circuit includes a multiplexer to provide a data signal to a plurality of delay elements in response to a clock signal, the plurality of delay elements providing the plurality of delayed data signals.

4. The integrated circuit of claim 3, further comprising:
   a locked loop circuit to provide current to bias the plurality of delay elements.

5. The integrated circuit of claim 1, wherein the adjustable impedance circuit includes a predriver circuit to buffer the first delayed data signal from the select circuit.

6. The integrated circuit of claim 1, further comprising:
   another adjustable impedance circuit including,
      another select circuit to provide a second delayed data signal from the plurality of delayed data signals in response to a signal indicating a selection of the second delayed data signal, the another select circuit adjusting a polarity of the second delayed data signal in response to a signal indicating a selection of the polarity of the second delayed data signal, and
      another driver circuit to provide an adjustable impedance in response to a signal indicating another impedance value so that the second delayed data signal is adjusted at the output,
      wherein the adjusted first delayed data signal and the adjusted second delayed data signal form an output data signal at the output having a predetermined slew rate and transmit pre-emphasis.

7. A wave shaping circuit comprising:
   a timing circuit to provide a plurality of delayed data signals, during a symbol time; and a plurality of impedance circuits to provide an output signal, wherein each impedance circuit in the plurality of impedance circuits selects at least one of the delayed data signals from the plurality of delayed data signals to output a selected delayed data signal, wherein each impedance circuit in the plurality of impedance circuits selects a polarity of a respective selected delayed data signal, wherein the wave shaping circuit operates in a first and second mode of operation, wherein during the first mode of operation, the plurality of impedance circuits provide a plurality of selected delayed data signals to form the output signal having a predetermined slew rate, and during the second mode of operation, the polarity of each of the plurality of selected delayed data signals is selected to provide the output signal having a predetermined transmit pre-emphasis.

8. The wave shaping circuit of claim 7, wherein the wave shaping circuit operates in a third mode of operation, wherein during the third mode of operation, the plurality of impedance circuits provide the plurality of selected delayed data signals and the polarity of each of the plurality of selected delayed data signals is selected to provide the output signal having the predetermined slew rate and the predetermined transmit pre-emphasis.

9. The wave shaping circuit of claim 7, wherein each impedance circuit in the plurality of impedance circuits selects at least one of the delayed data signals in response to a signal indicating a phase selection and each impedance circuit in the plurality of impedance circuits selects the polarity in response to a signal indicating a polarity selection.

10. The wave shaping circuit of claim 7, wherein the modes of operation are selected in response to a signal that indicates a type of the output signal.

11. The wave shaping circuit of claim 7, wherein the modes of operation are selected in response to a signal that indicates a frequency range of the output signal.

12. The wave shaping circuit of claim 7, wherein the modes of operation are selected in response to a signal that indicates a type of packaging of the wave shaping circuit.

13. The wave shaping circuit of claim 7, wherein the modes of operation are selected in response to a signal that indicates a system configuration of the wave shaping circuit.

14. The wave shaping circuit of claim 7, wherein the timing circuit includes a multiplexer to provide a data signal to a plurality of delay elements in response to a clock signal, the plurality of delay elements provide the plurality of delayed data signals.

15. The wave shaping circuit of claim 14, further comprising:

a locked loop circuit to provide current to bias the plurality of delay elements so that the slew rate of the output signal is further adjusted.

16. The wave shaping circuit of claim 7, wherein each impedance circuit in the plurality of impedance circuits includes a predriver circuit to buffer each of the plurality of selected delayed data signals and a driver circuit to adjust an impedance in response to a signal indicating an impedance value.

17. A method of operation in an integrated circuit comprising:

determining when to adjust a slew rate of an output signal;

adjusting the slew rate of the output signal at selected phases during a bit time;

determining when to adjust a transmit pre-emphasis of the output signal; and adjusting the transmit pre-emphasis of the output signal at selected phases during the bit time.

18. The method of claim 17, wherein adjusting the slew rate includes:

obtaining a plurality of delayed data signals;

selecting a first and second delayed data signal from the plurality of delayed data signals; and outputting the first and second delayed data signals to form the output signal.

19. The method of claim 18, wherein the adjusting the transmit pre-emphasis includes:

selecting a polarity of the second delayed data signal; and adjusting the polarity of the second delayed data signal to provide transmit pre-emphasis to the output signal.

20. The method of claim 18, wherein the adjusting the slew rate includes:

providing a bias current from a locked loop circuit to a plurality of delay elements that output the plurality of delayed data signals.

21. The method of claim 20, wherein adjusting the slew rate includes adjusting an impedance in response to a signal indicating an impedance value to adjust the output signal during the bit time.

22. Machine-readable media that stores executable instructions that represent a circuit comprising:

a timing circuit to provide a plurality of delayed data signals, during a time interval used to transfer a signal representing a bit of information, and an adjustable impedance circuit including, a select circuit to provide a first delayed data signal from the plurality of delayed data signals in response to a signal indicating a selection of the first delayed data signal, the select circuit adjusts a polarity of the first delayed data signal in response to a signal indicating a selection of the polarity of the first delayed data signal, and a driver circuit to provide an adjustable impedance in response to a signal indicating an impedance value so that the first delayed data signal is adjusted at an output.

23. An integrated circuit comprising:

a timing circuit to provide a plurality of delayed data signals; and means for adjusting a slew rate of an output signal in response to the plurality of delayed data signals; and means for adjusting a transmit pre-emphasis of the output signal in response to the plurality of delayed data signals and a polarity of at least one of the plurality of delayed data signals.

* * * * *